US012738438B2

(12) United States Patent
Chen et al.

(10) Patent No.: US 12,738,438 B2
(45) Date of Patent: Sep. 15, 2026

(54) GROUND FAULT CIRCUIT INTERRUPTER DEVICE AND RELATED ELECTRICAL CONNECTION DEVICES AND ELECTRICAL APPLIANCES

(71) Applicant: Chengli Li, Suzhou (CN)

(72) Inventors: Long Chen, Suzhou (CN); Jinmiao Lu, Suzhou (CN); Chengli Li, Suzhou (CN)

(73) Assignee: Chengli Li, Suzhou (CN)

( * ) Notice: Subject to any disclaimer, the term of this patent is extended or adjusted under 35 U.S.C. 154(b) by 202 days.

(21) Appl. No.: 18/918,672

(22) Filed: Oct. 17, 2024

(65) Prior Publication Data

US 2026/0094780 A1 Apr. 2, 2026

(30) Foreign Application Priority Data

Sep. 30, 2024 (CN) ........................ 202411388037.6

(51) Int. Cl.
*H01H 83/04* (2006.01)
*H01H 71/24* (2006.01)
*H01H 71/68* (2006.01)
*G01R 31/52* (2020.01)

(52) U.S. Cl.
CPC ........ *H01H 83/04* (2013.01); *H01H 71/2454* (2013.01); *H01H 71/68* (2013.01); *G01R 31/52* (2020.01)

(58) Field of Classification Search
CPC ........ H01H 83/04; H01H 83/00; H01H 83/02; H01H 83/045; H01H 83/10; H01H 83/12; G01R 31/52; G01R 31/50; G01R 31/55; G01R 31/56; G01R 31/58
See application file for complete search history.

(56) References Cited

U.S. PATENT DOCUMENTS

2005/0243484 A1* 11/2005 Kim ...................... H02H 3/335 361/42
2012/0119918 A1* 5/2012 Williams .............. H02H 3/335 324/509
2014/0278157 A1* 9/2014 Simonin ................. H02H 3/02 361/115

* cited by examiner

*Primary Examiner* — Nguyen Tran
(74) *Attorney, Agent, or Firm* — Chen Yoshimura LLP

(57) ABSTRACT

A ground fault circuit interrupter device includes a switch unit for controlling a power connection between input and output ends; a leakage protection unit including a leakage detection module, for generating a leakage fault signal upon detecting a leakage current signal, and a leakage drive module including a first coil, for driving the switch unit to disconnect the power connection in response to the leakage fault signal; a timing unit including a timing control module, for performing timing in response to a time duration setting signal and generating a timed trip signal after a first preset time duration elapses, a time duration setting module for sending the time duration setting signal to the timing control module, and a timing drive module including a second coil separate from the first coil, for driving the switch unit to disconnect the power connection in response to the timed trip signal.

17 Claims, 4 Drawing Sheets

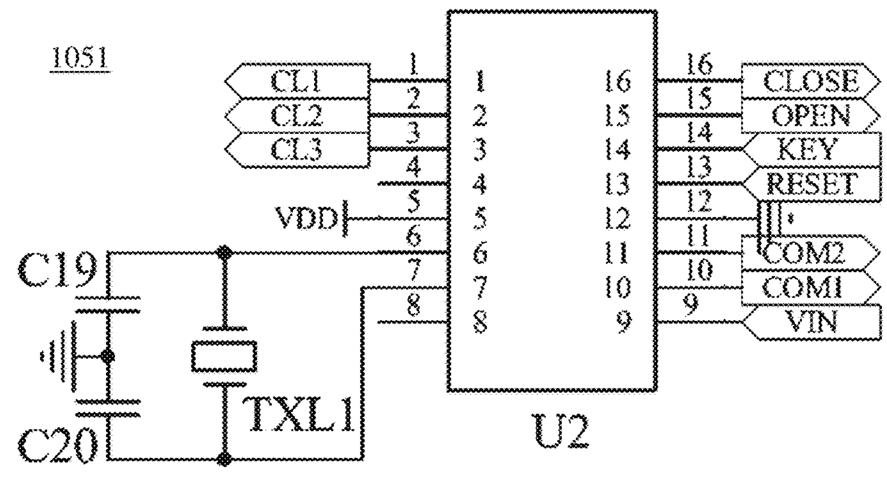
Fig. 3A
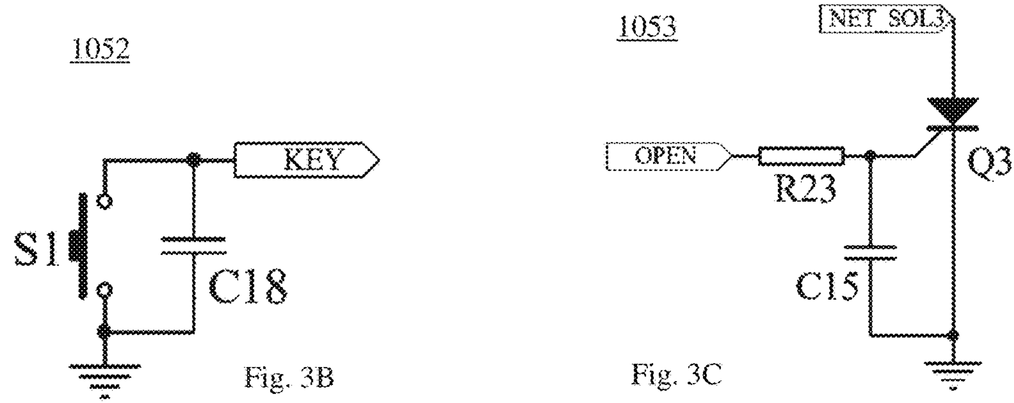
Fig. 3B
Fig. 3C
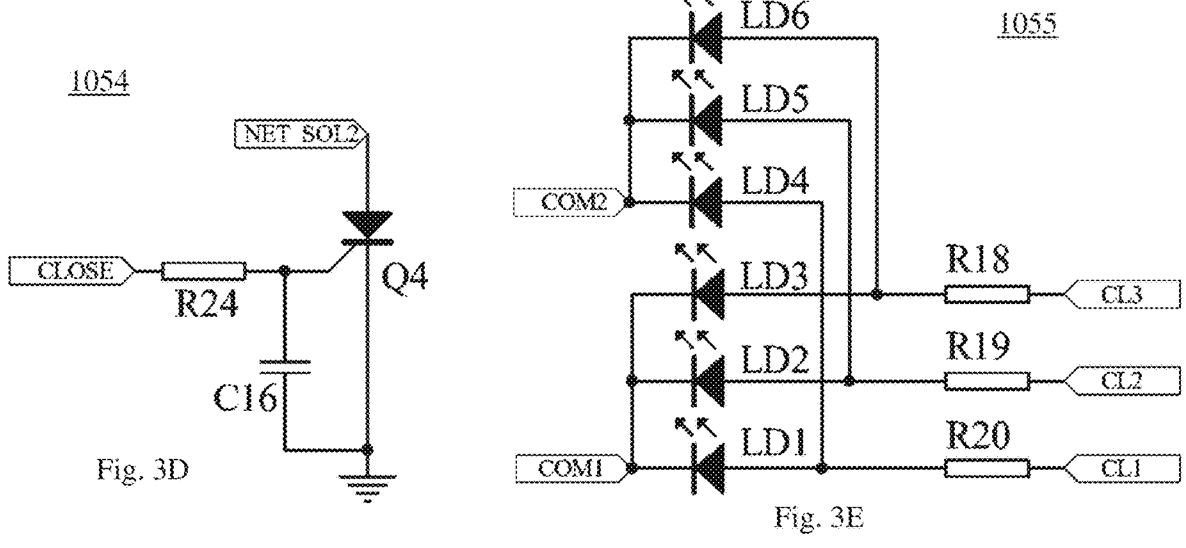
Fig. 3D
Fig. 3E

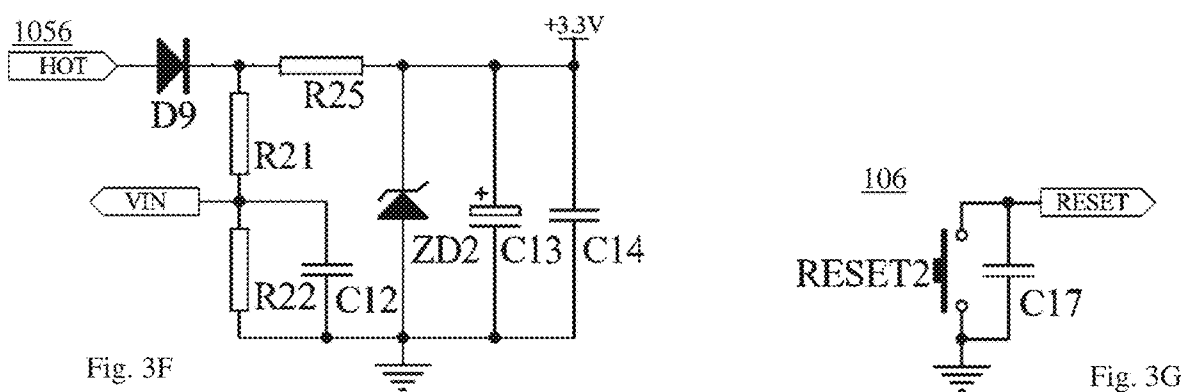
Fig. 3F
Fig. 3G
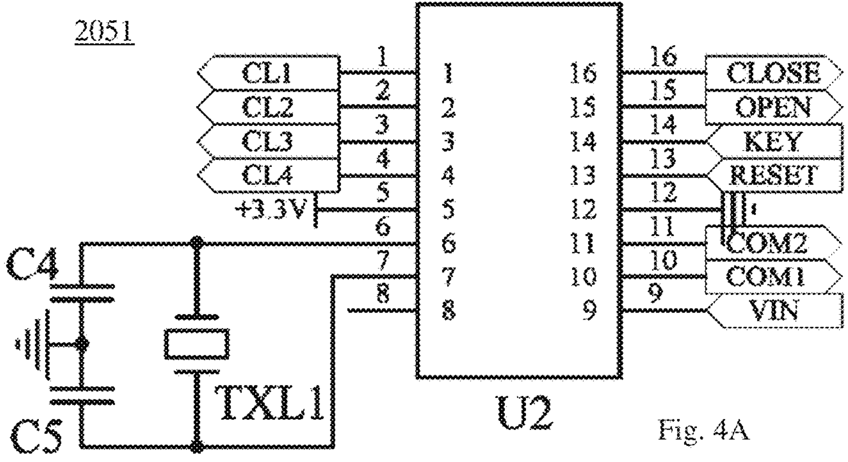
Fig. 4A
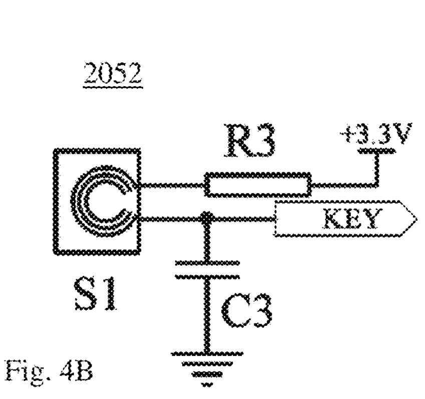
Fig. 4B
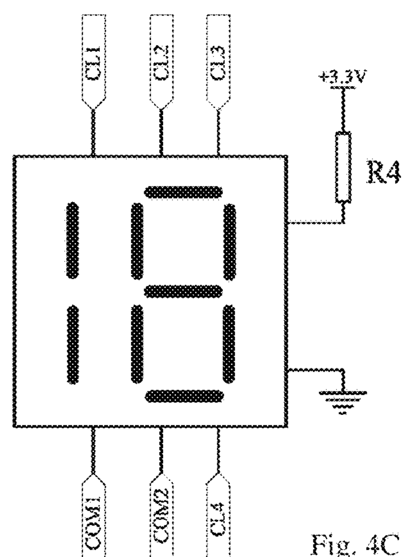
Fig. 4C

GROUND FAULT CIRCUIT INTERRUPTER DEVICE AND RELATED ELECTRICAL CONNECTION DEVICES AND ELECTRICAL APPLIANCES

BACKGROUND OF THE INVENTION

This invention relates to the electrical field, and in particular, it relates to ground fault circuit interrupter device and related electrical connection devices and electrical appliances.

With the increased living standard and the wide use of household appliances, personal and property safety accidents caused by electrical current leakage have also increased. Therefore, more and more electrical appliances are being equipped with ground fault circuit interrupters (GFCI) devices. However, some high-power electrical appliances only work at specific times. The inability to cut off the power supply when such appliances are in standby mode poses a safety risk.

Currently, some GFCI devices are equipped with timing functions. However, in some such GFCI devices, the leakage protection circuit and the timing circuit share a common switch and a common switch driving circuit to control the power connection. Thus, when the timing circuit is damaged or has a programming error, it will affect the leakage protection circuit, which may eventually lead to the loss of the leakage protection function, increasing risk and posing a safety hazard. In some other GFCI devices, the leakage protection circuit and the timing circuit drive different switches to control the power connection. In such devices, however, the switch that is independently controlled by the timing circuit requires a large and expensive power relay due to the large current on the current-carrying line, which increases the overall size of the device and the cost.

SUMMARY OF THE INVENTION

To solve the above problems, in a first aspect, the present invention provides a ground fault circuit interrupter device, which includes: a switch unit, coupled between an input end and an output end of current carrying lines, configured to control a power connection between the input end and the output end; a leakage protection unit, including: a leakage detection module, configured to detect a leakage current signal on the current carrying lines, and to generate a leakage fault signal in response to detecting the leakage current; and a leakage drive module, coupled to the switch unit and the leakage detection module, configured to drive the switch unit to disconnect the power connection in response to the leakage fault signal, wherein the leakage drive module includes a first coil; and a timing unit, including: a timing control module, configured to perform timing in response to a timing condition setting signal, and to generate a timed trip signal when a first timing condition specified in the timing condition setting signal is met; a time duration setting module, coupled to the timing control module, configured to transmit the timing condition setting signal to the timing control module; and a timing drive module, which is separate from the leakage drive module and is coupled to the timing control module and the switch unit, and configured to drive the switch unit to disconnect the power connection in response to the timed trip signal, wherein the timing drive module includes a second coil which is separate from the first coil.

In some embodiments, the timing control module is further configured to generate a reset drive signal, and wherein the timing unit further includes: a reset driving module, which is separate from the leakage driving module and is coupled to the timing control module and the switch unit, configured to drive the switch unit to connect the power connection in response to the reset driving signal, wherein the reset driving module includes a third coil separate from the first coil.

In some embodiments, the timing control module is further configured to continue timing after generating the timed trip signal and to generate the reset driving signal when a second timing condition is met.

In some embodiments, the second coil and the third coil have a common terminal, and the common terminal is coupled to the input end.

In some embodiments, the first coil, the second coil and the third coil share a coil frame.

In some embodiments, the device further includes: a reset unit, coupled to the timing control module and the leakage driving module, and configured to generate a first reset signal and a second reset signal in response to external operations; wherein the timing control module is further configured to generate the reset driving signal in response to the first reset signal to drive the switch unit to connect the power connection, and the leakage driving module is further configured to maintain the switch unit to connect the power connection in response to the second reset signal.

In some embodiments, the reset unit includes a first reset switch coupled to the timing control module and a second reset switch coupled to the leakage driving module.

In some embodiments, the reset driving module further includes a first semiconductor element coupled to the third coil and configured to control a current flowing through the third coil in response to the reset driving signal, thereby connecting the power connection.

In some embodiments, the timing driving module further includes a second semiconductor element coupled to the second coil and configured to control a current flowing through the second coil in response to the timed trip signal, thereby disconnecting the power connection.

In some embodiments, the leakage driving module further includes a third semiconductor element coupled to the first coil and configured to control a current flowing through the first coil in response to the leakage fault signal, thereby disconnecting the power connection.

In some embodiments, the timing control module is further configured to generate time information based on the first timing condition, and the timing unit further includes: a time display module, which is coupled to the timing control module and configured to display the time information.

In some embodiments, the time display module includes one of a light emitting diode, a digital tube and a liquid crystal display screen.

In some embodiments, the time duration setting module includes one of a key switch, a pressure sensor, a touch sensor, a potentiometer and a multi-level switch.

In some embodiments, the timing unit further includes: a power supply module, coupled to the timing control module and configured to provide power to the timing control module.

In some embodiments, the leakage protection unit also includes: a self-test module, coupled to the leakage detection module and the leakage driving module, configured to periodically generate the simulated leakage current to test whether the leakage detection module and/or the leakage driving module has a fault, and to generate a self-test fault signal when the leakage detection module and/or the leakage driving module has the fault.

In a second aspect, the present invention provides an electrical power connection device, including a body and a ground fault circuit interrupter device according to any of the above embodiments, disposed inside the body.

In a third aspect, the present invention provides an electrical appliance, including an electrical load and an electrical power connection device coupled between a power supply and the electrical load to supply power to the electrical load, where the electrical power connection device includes a ground fault circuit interrupter device according to any of the above embodiments.

Embodiments of the present invention provide separate driving circuits for the leakage protection function and the timing function of the ground fault circuit interrupter device, which drive the same switch to control the power connection between the input end and the output end, thereby eliminating potential safety hazards, further improving the safety of the device, saving costs, and reducing the size of the device. In addition, the device according to embodiments of the present invention has a simple circuit structure, low cost and high safety.

BRIEF DESCRIPTION OF DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

FIGS. 3A-3G illustrate certain electrical circuit modules of the GFCI device of FIG. 2.

FIGS. 4A-4C illustrate certain electrical circuit modules of a GFCI device according to another embodiment of the present invention.

DETAILED DESCRIPTION OF THE INVENTION

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

Embodiments of the present invention provide a ground fault circuit interrupter (GFCI) device. In this device, separate driving circuits are provided for the leakage protection function and the timing function, to drive a common switch to control the power connection between the input end and the output end. Thus, potential safety hazards are eliminated, and the safety of the ground fault protection device is further improved while saving costs and reducing the size of the device. Further, the device has a simple circuit structure, low cost and high safety.

Figure 1:
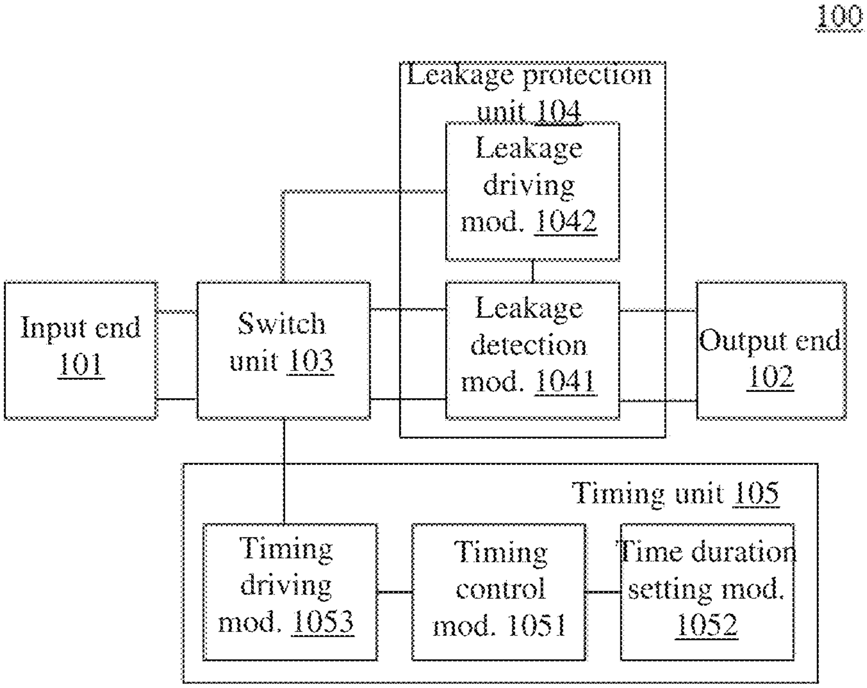
FIG. 1 is a block diagram showing a GFCI device according to an embodiment of the present invention.

FIG. 1 is a block diagram showing a GFCI device according to an embodiment of the present invention. As shown in FIG. 1, the GFCI device 100 includes a switch unit 103, a leakage protection unit 104, and a timing unit 105. The switch unit 103 is coupled between the input end 101 and the output end 102 of the current-carrying line, and controls the power connection between the input end 101 and the output end 102 (where an electrical load may be connected). The current-carrying line may include a first current-carrying line (HOT) for connecting to a phase line of a power grid and a second current-carrying line (WHITE) for connecting to a neutral line of a power grid, that is, the first current-carrying line is a phase line, and the second current-carrying line is a neutral line. The leakage protection unit 104 includes a leakage detection module 1041 and a leakage driving module 1042. The leakage detection module 1041 is configured to detect a leakage current signal on the current-carrying line and generate a leakage fault signal when the leakage current signal is detected. The leakage driving module 1042 is coupled to the switch unit 103 and the leakage detection module 1041, and configured to receive the leakage fault signal, and to drive the switch unit 103 to disconnect the power connection in response to the leakage fault signal. The leakage driving module 1042 includes a first coil, and drives the switch unit 103 to connect or disconnect the power connection between the input end 101 and the output end 102 by controlling the current flowing through the first coil.

The timing unit 105 includes a timing control module 1051, a time duration setting module 1052 and a timing driving module 1053. The timing control module 1051 performs timing in response to preset time duration signals, and generates a timed trip signal after reaching a first preset time duration. The first preset duration may be, for example, a preset working time duration of the electrical load (i.e. the length of time during which the load will be working). The time duration setting module 1052 is coupled to the timing control module 1051 and sends a time duration setting signal to the timing control module 1051. A time duration setting signal may be sent to the timing control module 1051 through manual operation (e.g., by operating one or more buttons). The timing driving module 1053 is provided separately from the leakage driving module 1042 and is coupled to the timing control module 1051 and the switch unit 103. The timing driving module 1053 drives the switch unit 103 to disconnect the power connection in response to the timed trip signal. The timing driving module 1053 includes a second coil separate from the first coil, drives the switch unit 103 to connect or disconnect the power connection between the input end 101 and the output end 102 by controlling the current flowing through the second coil.

In some embodiments, the timing unit 105 further includes a reset drive module (not shown in FIG. 1), and the timing control module 1051 further generates a reset drive signal. The reset drive module is provided separately from the leakage drive module 1042, and is coupled to the timing control module 1051 and the switch unit 103. The reset drive module receives a reset drive signal and drives the switch unit 103 to connect the power connection between the input end 101 and the output end 102 in response to the reset drive signal. The reset drive module includes a third coil of the first coil, and drives the switch unit 103 to connect or disconnect the power connection between the input end 101 and the output end 102 by controlling the current flowing through the third coil. By providing the reset drive module, the GFCI device 100 can have a timed reset function, which increases the convenience and flexibility of the device and its application.

In some embodiments, the timing control module 1051 continues timing after generating the timed trip signal, and generates a reset drive signal after a second preset time duration has elapsed. The second preset time duration may be, for example, a preset standby time duration of the load device (during which the load will not be working). In this way, the GFCI device 100 can automatically perform a timed reset without manual operation, further increasing the convenience and flexibility of the device and its use.

In some embodiments, the second coil and the third coil have a common terminal, and the common terminal is coupled to the input end. In this way, manufacturing the GFCI device 100 can be made more convenient.

In some embodiments, the first coil, the second coil and the third coil share a coil frame. In this way, the manufacturing cost of the GFCI device 100 can be further reduced and its volume can be reduced.

In some embodiments, the GFCI device 100 further includes a reset unit (not shown in FIG. 1). The reset unit is coupled to the timing control module 1051 and the leakage driving module 1042, and generates a first reset signal and a second reset signal when it is operated externally. The timing control module 1051 receives the first reset signal, and generates a reset driving signal in response to the first reset signal to drive the switch unit 103 to connect the power connection. The leakage driving module 1042 receives the second reset signal, and drives the switch unit 103 to maintain the power connection in response to the second reset signal. By providing the reset unit, the GFCI device 100 can be reset when needed, further increasing the convenience and flexibility of the device and its application.

In some embodiments, the reset unit includes a first reset switch coupled to the timing control module 1051 and a second reset switch coupled to the leakage driving module 1042. The first reset signal may be generated by operating the first reset switch and the second reset signal may be generated by operating the second reset switch.

In some embodiments, the reset drive module further includes a first semiconductor element. The first semiconductor element is coupled to the third coil and controls the current flowing through the third coil in response to the reset drive signal, thereby connecting the power connection. The first semiconductor element can be any one of a silicon-controlled rectifier, a bipolar transistor, a field effect transistor, and a photoelectric coupling element.

In some embodiments, the timing drive module 1052 further includes a second semiconductor element. The second semiconductor element is coupled to the second coil, and controls the current flowing through the second coil in response to the timed trip signal, thereby disconnecting the power connection. The second semiconductor element can be any one of a silicon-controlled rectifier, a bipolar transistor, a field effect transistor, and a photoelectric coupling element.

In some embodiments, the leakage driving module 1042 further includes a third semiconductor element. The third semiconductor element is coupled to the first coil, and controls the current flowing through the first coil in response to the leakage fault signal, thereby disconnecting the power connection. The third semiconductor element can be any one of a silicon-controlled rectifier, a bipolar transistor, a field effect transistor, and a photoelectric coupling element.

In some embodiments, the timing control module 1051 further generates time information based on the first preset time duration. The timing unit 105 further includes a time display module, which is coupled to the timing control module 1051 and displays the time information. In this way, the user can conveniently view the time information related to the device's operation.

In some embodiments, the time display module includes one of a light emitting diode, a digital tube and a liquid crystal display screen.

In some embodiments, the time duration setting module 1052 includes any one of a key switch, a pressure sensor, a touch sensor, a potentiometer, and a multi-level switch.

In some embodiments, the timing unit 105 further includes a power supply module, which is coupled to the timing control module 1051 and provides the timing control module 1051 with required power.

In some embodiments, the leakage protection unit 104 further includes a self-test module, which is coupled to the leakage detection module 1041 and the leakage driving module 1042, and periodically generates a simulated leakage current to test whether the leakage detection module 1041 and/or the leakage driving module 1042 has a fault, and generates a self-test fault signal when the leakage detection module 1041 and/or the leakage driving module 1042 has a fault.

Figure 2:
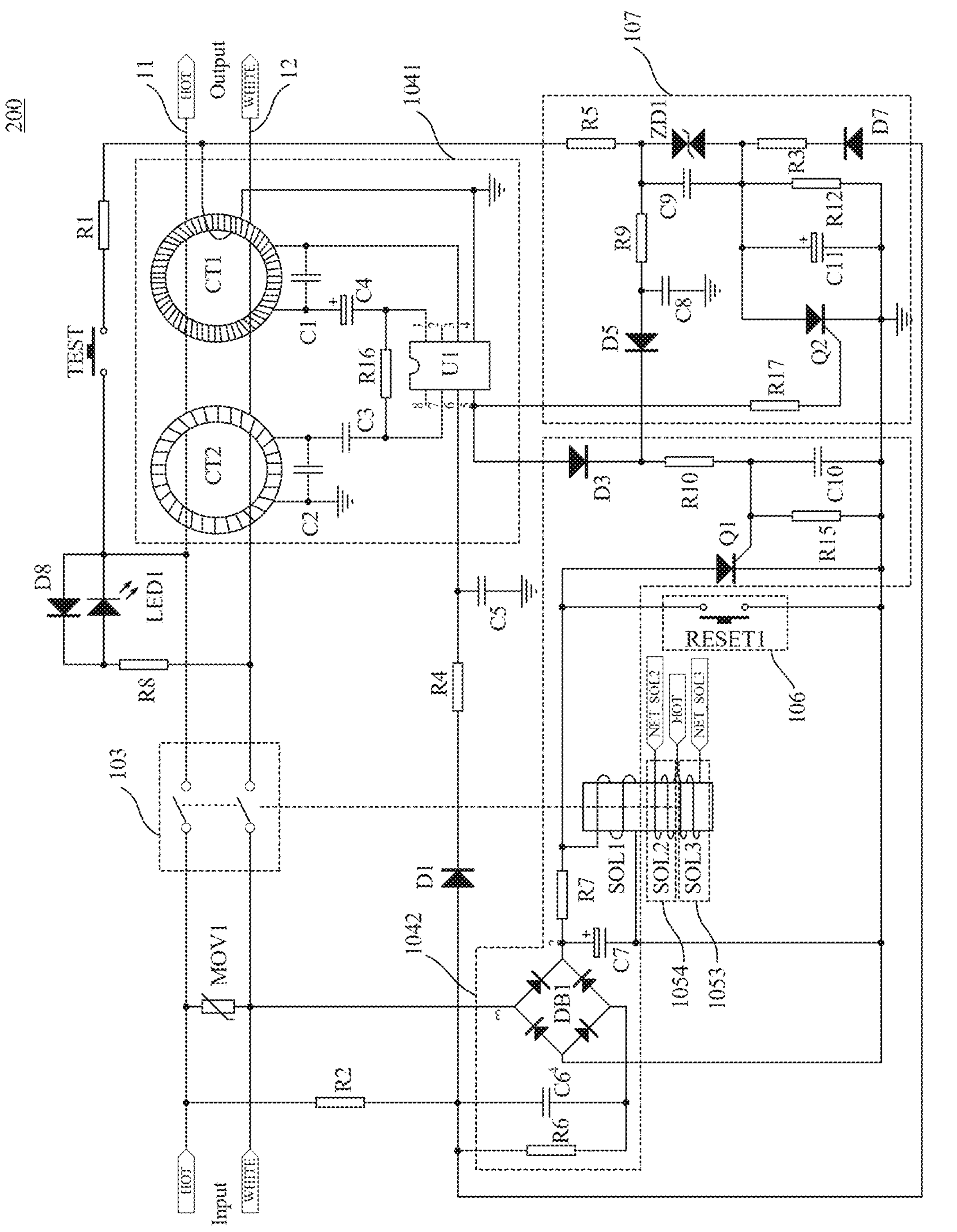
FIG. 2 is a circuit diagram of a GFCI device according to an embodiment of the present invention.

A GFCI device according to an embodiment of the present invention is described below with reference to FIGS. 2-3G. FIG. 2 is a circuit diagram of a ground fault protection device according to an embodiment of the present invention. FIGS. 3A-3G illustrate certain electrical circuit modules of the embodiment of FIG. 2.

Referring to FIGS. 2-3G, the ground fault circuit interrupter device 200 is coupled between a power supply line and an electrical load, and includes a switch unit 103, a leakage protection unit, a timing unit, a reset unit 106, and a self-test unit 107. The current-carrying line includes a first current-carrying line (HOT) 11 and a second current-carrying line (WHITE) 12, that is, the first current-carrying line 11 is a phase line, and the second current-carrying line 12 is a neutral line. The switch unit 103 is coupled between the input end and the output end of the current-carrying line, and is configured to control the power connection of the current-carrying line. The leakage protection unit includes a leakage detection module 1041 and a leakage drive module 1042. The leakage detection module 1041 includes current transformers CT1 and CT2, a leakage detection chip U1 and its peripheral circuits. The first current-carrying line 11 and the second current-carrying line 12 pass through the current transformers CT1 and CT2. The leakage drive module 1042 includes a first coil SOL1, a silicon-controlled rectifier Q1 (a third semiconductor element) and its peripheral circuits. The timing unit includes a timing control module 1051, a time duration setting module 1052, a timing driving module 1053, a reset driving module 1054, a time display module 1055 and a power supply module 1056.

The timing control module 1051 includes a timing control chip U2 and its peripheral circuits. The time duration setting module 1052 includes a capacitor C18 and a key switch S1 coupled in parallel, one of their parallelly-coupled ends is coupled to ground, and the other one is coupled to a pin 14 (shown as KEY in FIG. 3A) of the timing control chip U2. The timing drive module 1053 is separate from the leakage drive module 1042, and includes a second coil SOL3 separate from the first coil SOL1 and a silicon-controlled rectifier Q3 (a second semiconductor element). The control electrode of the silicon-controlled rectifier Q3 is coupled to pin 15 (shown as OPEN in FIG. 3A) of the timing control chip U2; its anode is coupled to one end of the second coil SOL3 (shown as NET_SOL3 in FIG. 2), and its cathode is grounded.

The reset driving module 1054 is separate from the leakage driving module 1042, and includes a third coil SOL2 separate from the first coil SOL1 and a silicon-controlled rectifier Q4 (a first semiconductor element). The second coil SOL3 and the third coil SOL2 can be two coils separate from each other, or two coils that are not separate. For example, the second coil SOL3 and the third coil SOL2 may share part of the winding. Or, the second coil SOL3 and the third coil SOL2 may be the same coil, and a specific connection scheme is used to make the current flowing through in in opposite directions, thereby realizing the respective functions of the second coil SOL3 and the third coil SOL3. The control electrode of the silicon-controlled rectifier Q4 is coupled to pin 16 of the timing control chip U2 (shown as CLOSE in FIG. 3A); its anode is coupled to one end of the third coil SOL2 (shown as NET_SOL2 in FIG. 2); and its cathode is grounded. The second coil SOL3 and the third coil SOL2 have a common terminal, which is coupled to the input end of the first current-carrying line 11 (shown as HOT in FIG. 2). As shown in FIG. 2, the first coil SOL1, the second coil SOL3, and the third coil SOL2 share a coil frame. When a current flows through the first coil SOL1, the second coil SOL3, or the third coil SOL2, the magnetic fields generated by the first coil SOL1 and the third coil SOL2 have the same direction, but are opposite to the magnetic field generated by the second coil SOL3.

The time display module 1055 is coupled to pins 1-3 (shown as CL1-CL3 in FIG. 3A) and 10-11 (shown as COM1 and COM2 in FIG. 3A) of the timing control chip U2, and is configured to receive and display the time information generated by the timing control chip U2. The time display module 1055 may include a plurality of light-emitting diodes to display the time information. The power supply module 1056 is coupled to the input end of the first current-carrying line 11 (shown as HOT in FIG. 2), and the current flows through a current loop formed by the first current-carrying line 11-D9-R25-ZD2 to generates a +3.3V regulated voltage supply to power the timing control chip U2. The power supply module 1056 also includes voltage divider circuits R21 and R22, which are coupled in series and coupled to pin 9 (shown as VIN in FIG. 3A) of the timing control chip U2.

As shown in FIG. 2 and FIG. 3G, the reset unit 106 includes a first reset switch RESET2 and a capacitor C17 coupled in parallel; one of their parallelly coupled ends is coupled to ground, and the other one is coupled to pin 13 (shown as RESET in FIG. 3A) of the timing control chip U2. The reset unit 106 also includes a second reset switch RESET1 coupled in parallel with the silicon-controlled rectifier Q1 of the leakage drive module 1042. The self-test module 107 includes a trigger diode ZD1, a capacitor C11, a silicon-controlled rectifier Q2, and peripheral components. The control electrode of the silicon-controlled rectifier Q2 is coupled to pin 5 of the leakage detection chip U1.

The GFCI device 200 has a leakage protection function. Under normal working conditions, a current flows through the first current-carrying line 11-C6-DB1-R7-SOL1-GND, and a magnetic field is generated on the first coil SOL1, which maintains the power connection between the input end and the output end of the switch unit 103. Meanwhile, a current flows through the first current-carrying line 11-D1-R4 to supply the leakage detection chip U1. When a leakage current is present on the first current-carrying line 11 or the second current-carrying line 12, the current transformer CT1 detects the leakage current signal, and generates a corresponding induction signal on its secondary winding, which is transmitted to the leakage detection chip U1 for processing. When the value of the processed leakage current is greater than a preset threshold, pin 5 of the leakage detection chip U1 outputs a high voltage level (the leakage fault signal), otherwise it outputs a low voltage level. The high voltage level on pin 5 of the leakage detection chip U1 is provided to the control electrode of the silicon-controlled rectifier Q1 via a diode D3 and a resistor R10, triggering the silicon-controlled rectifier Q1 to become conductive and remain conductive. As a result, the current no longer flows through the first coil SOL1, but flows through the silicon-controlled rectifier Q1-GND. The magnetic field on the first coil SOL1 disappears, driving the switch unit 103 to disconnect the power connection between the input end and the output end, thereby achieving leakage protection.

The GFCI device 200 also has a self-test function. A current charges the capacitor C11 through the first current-carrying line 11-D7-R3. As the voltage across the capacitor C11 increases, the voltage across the trigger diode ZD1 also increases. After a preset period of time, the voltage across the trigger diode ZD1 reaches its trigger threshold, the trigger diode ZD1 becomes conductive, and a current flows through the current transformer CT1 via C11-ZD1-R5 to generate a simulated leakage current, and charging capacitor C8 via resistor R9 at the same time. In the normal working state of the device 200, that is, the leakage detection module 1041 and the leakage driving module 1042 are both working normally, the current transformer CT1 detects the simulated leakage current, and generates a corresponding induction signal in its secondary winding, which is transmitted to the leakage detection chip U1. Pin 5 of the leakage detection chip U1 outputs a high voltage level, and a current flows through D3-R10 to charge the capacitor C10. At the same time, a current flows through R17 to trigger the silicon-controlled rectifier Q2 to become conductive. The capacitor C11 is rapidly discharged through the silicon-controlled rectifier Q2, and the voltage at the upper end of the capacitor C11 drops rapidly. When this voltage drops to below the trigger voltage of the trigger diode ZD1, trigger diode ZD1 is turned off and no longer conductive. As a result, pin 5 of the leakage detection chip U1 becomes a low voltage level. Since the time of this process is extremely short, the voltages across the capacitors C8 and C10 are relatively low, which is insufficient to trigger the silicon-controlled rectifier Q1 to become conductive, and thus will not affect the normal operation of the GFCI device 200. In this process, the switch unit 103 will not be disconnected, but will remain in a closed state.

When the leakage detection module 1041 has a fault and cannot detect the simulated leakage current, pin 5 of the leakage detection chip U1 remains at a low voltage level, and cannot trigger the silicon-controlled rectifier Q2 to become conductive. As a result, capacitor C11 cannot quickly discharge through the silicon-controlled rectifier Q2, and the trigger diode ZD1 remains conductive for a long time. The current through ZD1 and resistor R9 continues to charge the capacitor C8 (i.e., a self-test fault signal is generated), so that the voltage across capacitor C8 rises to a certain level, which is sufficient to trigger the silicon-controlled rectifier Q1 to become conductive through D5-R10. As a result, the current no longer flows through the first coil SOL1, but flows through the silicon-controlled rectifier Q1-GND, the magnetic field on the first coil SOL1 disappears, and the driving switch unit 103 disconnects the power connection between the input end and the output end, thereby realizing fault self-test.

The GFCI device 200 also has a timing function. A current flows through the first current-carrying line 11-D9-R25-ZD2 to generate a regulated +3.3V power supply to supply the timing control chip U2. Meanwhile, the voltage of the current carrying lines is voltage-divided by resistors R21 and R22 and input to the timing control chip U2. The timing control chip U2 determines whether this input voltage is greater than a preset value. When it is greater than the preset value, pin 16 of the timing control chip U2 outputs a high voltage level pulse signal (the reset drive signal), triggering the silicon-controlled rectifier Q4 of the reset drive module 1054 to become conductive, and a relatively large current flows through the first current-carrying line 11-SOL2-Q4-GND. As a result, the third coil SOL2 generates a relatively large magnetic field, driving the switch unit 103 to connect the power connection between the input end and the output end.

When the key switch S1 of the time setting module 1052 is depressed, the time setting module 1052 transmits a low voltage level signal (the time duration setting signal) to pin 14 of the timing control chip U2 to set the first preset time duration. The timing control chip U2 determines the first preset time duration and starts timing. The first preset time duration may be, for example, the working time duration of the electrical load, which may alternatively be preset internally in the timing control chip U2. In addition, the timing control chip U2 generates time information based on the first preset time duration, and drives LD1-LD6 of the time display module 1055 to display the time information. The time information may be, for example, a countdown starting from the first preset time duration, which indicates to the user the remaining working time of the electrical load. When the first preset time duration elapses, the timing control chip U2 generates and transmits a high voltage level pulse signal (the timed trip signal) through pin 15, triggering the silicon-controlled rectifier Q3 of the timing drive module 1053 to become conductive. As a result, a relatively large current flows through the first current-carrying line 11-SOL3-Q3-GND, and the second coil SOL3 generates a relatively large magnetic field (which at least offsets a part of the magnetic field generated by the first coil SOL1, so that the switch unit 103 cannot remain in the closed state), driving the switch unit 103 to disconnect the power connection between the input end and the output end.

The timing control chip U2 continues timing after transmitting the high voltage level pulse signal. When a second preset time duration elapses (i.e., entering the next time period), it generates and transmits a high voltage level pulse signal (the reset drive signal) again through pin 16, triggering the silicon-controlled rectifier Q4 of the reset drive module 1054 to be conductive, driving the switch unit 103 to connect the power connection between the input end and the output end. The second preset time duration may be, for example, the standby time duration of the electrical load, which may either be preset internally in the timing control chip U2 or be set by manually operating the button S1. The timing control chip U2 may also generate time information based on the second preset time duration, and drive LD1-LD6 of the time display module 1055 to display the time information. The time information at this time may be, for example, a countdown starting from the second preset time duration, which indicates to the user the remaining standby time of the electrical load.

Further, when the GFCI device 200 detects a leakage current and trips, it may be reset through the reset unit 106. When the first reset switch RESET2 and the second reset switch RESET1 of the reset unit 106 are depressed, the reset unit 106 transmits a low voltage level signal (the first reset signal) to the timing control chip U2, and in response, the timing control chip U2 generates and transmits a high voltage level pulse signal (the reset drive signal) again through pin 16, triggering the silicon-controlled rectifier Q4 of the reset drive module 1054 to become conductive, which drives the switch unit 103 to connect the power connection between the input end and the output end. On the other hand, depressing the second reset switch RESET1 turns off the silicon-controlled rectifier Q1, so the current flows through the first coil SOL1 again, maintaining the switch unit 103 closed to connect the power connection between the input end and the output end.

FIGS. 4A-4C illustrate certain electrical circuit modules of a ground fault circuit interrupter device according to another embodiment of the present invention.

In this embodiment, the time duration setting module 2052 includes a pressure sensor S1 and is coupled to pin 14 of the timing control module 2051. The time duration setting module 2052 may be provided with a +3.3V power supply voltage by the power supply module that provides power to the timing control module 2051. When the pressure sensor S1 detects an external pressing force, the time duration setting module 2052 sends a low voltage level signal (the time duration setting signal) to pin 14 of the timing control chip U2 to set the first preset time duration, and the timing control chip U2 determines the first preset time duration and starts timing. The time display module 2055 includes a digital tube, which is coupled to pins 1-4 (shown as CL1-CL4 in FIG. 4A) and 10-11 (shown as COM1 and COM2 in FIG. 4A) of the timing control chip U2, and receives and displays the time information sent by the timing control chip U2.

In other embodiments, the time duration setting module 2052 may include other types of time duration setting elements, such as a touch sensor, a potentiometer, or a multi-level switch. The time display module 2055 may include other types of display elements, such as a liquid crystal display screen.

In the above embodiments, the timing function is described using preset time durations as timing condition. I.e., the timed trip and reset operations are performed after the elapse of specified time durations. Alternatively, the timing functions may be performed based on preset time points as the timing conditions, i.e., the timed trip and reset operations may be performed at specified time points (e.g., time of the day). More generally, the timing control module and the time duration setting module may use any suitable timing conditions to set the times and perform the timing, where the timing condition may be expressed using time durations or time points or combinations thereof, and the timed trip or reset operations are performed when the timing condition is met (the specified time duration has elapsed, or the specified time point is reached).

In a second aspect, embodiments of the present invention provide an electrical power connection device, which includes a body and a GFCI device according to any one of the above embodiments disposed inside the body.

In a third aspect, embodiments of the present invention provide an electrical appliance, which includes an electrical load, and an electrical power connection device coupled between a power supply and the load to supply power to the load, where the electrical power connection device employs a GFCI device according to any one of the above embodiments.

While the present invention is described above using specific examples, these examples are only illustrative and do not limit the scope of the invention. It will be apparent to those skilled in the art that various modifications, additions and deletions can be made to the GFCI device of the present invention without departing from the spirit or scope of the invention.

The invention claimed is:

1. A ground fault circuit interrupter device, comprising:

a switch unit, coupled between an input end and an output end of current carrying lines, configured to control a power connection between the input end and the output end;

a leakage protection unit, comprising:

a leakage detection module, configured to detect a leakage current signal on the current carrying lines, and to generate a leakage fault signal in response to detecting the leakage current; and a leakage drive module, coupled to the switch unit and the leakage detection module, configured to drive the switch unit to disconnect the power connection in response to the leakage fault signal, wherein the leakage drive module includes a first coil; and a timing unit, comprising:

a timing control module, configured to perform timing in response to a timing condition setting signal, and to generate a timed trip signal when a first timing condition specified in the timing condition setting signal is met;

a time duration setting module, coupled to the timing control module, configured to transmit the timing condition setting signal to the timing control module; and a timing drive module, which is separate from the leakage drive module and is coupled to the timing control module and the switch unit, and configured to drive the switch unit to disconnect the power connection in response to the timed trip signal, wherein the timing drive module includes a second coil which is separate from the first coil.

2. The ground fault circuit interrupter device of claim 1, wherein the timing control module is further configured to generate a reset drive signal, and wherein the timing unit further includes:

a reset driving module, which is separate from the leakage driving module and is coupled to the timing control module and the switch unit, configured to drive the switch unit to connect the power connection in response to the reset driving signal, wherein the reset driving module includes a third coil separate from the first coil.

3. The ground fault circuit interrupter device of claim 2, wherein the timing control module is further configured to continue timing after generating the timed trip signal and to generate the reset driving signal when a second timing condition is met.

4. The ground fault circuit interrupter device of claim 2, wherein the second coil and the third coil have a common terminal, and the common terminal is coupled to the input end.

5. The ground fault circuit interrupter device of claim 2, wherein the first coil, the second coil and the third coil share a coil frame.

6. The ground fault circuit interrupter device of claim 2, further comprising:

a reset unit, coupled to the timing control module and the leakage driving module, and configured to generate a first reset signal and a second reset signal in response to external operations;

wherein the timing control module is further configured to generate the reset driving signal in response to the first reset signal to drive the switch unit to connect the power connection, and the leakage driving module is further configured to maintain the switch unit to connect the power connection in response to the second reset signal.

7. The ground fault circuit interrupter device of claim 6, wherein the reset unit includes a first reset switch coupled to the timing control module and a second reset switch coupled to the leakage driving module.

8. The ground fault circuit interrupter device of claim 2, wherein the reset driving module further includes a first semiconductor element coupled to the third coil and configured to control a current flowing through the third coil in response to the reset driving signal, thereby connecting the power connection.

9. The ground fault circuit interrupter device of claim 1, wherein the timing driving module further includes a second semiconductor element coupled to the second coil and configured to control a current flowing through the second coil in response to the timed trip signal, thereby disconnecting the power connection.

10. The ground fault circuit interrupter device of claim 1, wherein the leakage driving module further includes a third semiconductor element coupled to the first coil and configured to control a current flowing through the first coil in response to the leakage fault signal, thereby disconnecting the power connection.

11. The ground fault circuit interrupter device of claim 1, wherein the timing control module is further configured to generate time information based on the first timing condition, and the timing unit further includes:

a time display module, which is coupled to the timing control module and configured to display the time information.

12. The ground fault circuit interrupter device of claim 11, wherein the time display module includes one of a light emitting diode, a digital tube and a liquid crystal display screen.

13. The ground fault circuit interrupter device of claim 1, wherein the time duration setting module includes one of a key switch, a pressure sensor, a touch sensor, a potentiometer and a multi-level switch.

14. The ground fault circuit interrupter device of claim 1, wherein the timing unit further includes:

a power supply module, coupled to the timing control module and configured to provide power to the timing control module.

15. The ground fault circuit interrupter device of claim 1, wherein the leakage protection unit also includes:

a self-test module, coupled to the leakage detection module and the leakage driving module, configured to periodically generate the simulated leakage current to test whether the leakage detection module and/or the leakage driving module has a fault, and to generate a self-test fault signal when the leakage detection module and/or the leakage driving module has the fault.

16. An electrical power connection device, comprising:

a body; and a ground fault circuit interrupter device of claim 1, disposed inside the body.

17. An electrical appliance, comprising:

an electrical load; and an electrical power connection device coupled between a power supply and the electrical load to supply power to the electrical load, where the electrical power connection device includes a ground fault circuit interrupter device of claim 1.

* * * * *